US 011817886B2

(12) United States Patent
Parker

(10) Patent No.: US 11,817,886 B2
(45) Date of Patent: Nov. 14, 2023

(54) PARALLEL DECOMPRESSION OF COMPRESSED DATA STREAMS

(71) Applicant: NVIDIA Corporation, Santa Clara, CA (US)

(72) Inventor: Steven Parker, Draper, UT (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/879,436

(22) Filed: Aug. 2, 2022

(65) Prior Publication Data

US 2022/0376701 A1 Nov. 24, 2022

Related U.S. Application Data

(63) Continuation of application No. 17/002,564, filed on Aug. 25, 2020, now Pat. No. 11,405,053.

(51) Int. Cl.
| | |
|---|---|
| *H03M 7/30* | (2006.01) |
| *G06T 1/20* | (2006.01) |
| *H03M 7/40* | (2006.01) |
| *G06F 9/46* | (2006.01) |

(52) U.S. Cl.
CPC .......... *H03M 7/3088* (2013.01); *G06F 9/466* (2013.01); *G06T 1/20* (2013.01); *H03M 7/3084* (2013.01); *H03M 7/40* (2013.01); *H03M 7/4031* (2013.01); *H03M 7/6005* (2013.01); *H03M 7/6023* (2013.01)

(58) Field of Classification Search
CPC .... H03M 7/3088; H03M 7/40; H03M 7/3084; H03M 7/4031; H03M 7/6023; H03M 7/6005; G06F 9/466; G06F 16/1744; G06F 3/0644; G06F 3/0656; G06T 1/20
USPC ..................................................... 341/51, 87
See application file for complete search history.

(56) References Cited

U.S. PATENT DOCUMENTS

| 9,264,068 B2 * | 2/2016 | Wu ..................... H03M 7/3095 |
| 10,230,392 B2 * | 3/2019 | Gopal ................. H03M 7/6023 |

OTHER PUBLICATIONS

An LZ Codec Designed for SSE Decompression. Feb. 15, 2016. Retrieved from the Internet on Jul. 17, 2020 from URL <https://conorstokes.github.io/compression/2016/02/15/an-LZ-codec-designed-for-SSE-decompression>.
Weiβenberger, A., & Schmidt, B. (Aug. 2018). Massively parallel Huffman decoding on GPUs. In Proceedings of the 17th International Conference on Parallel Processing (pp. 1-10).
(Continued)

*Primary Examiner* — Khai M Nguyen
(74) *Attorney, Agent, or Firm* — Taylor English Duma L.L.P.

(57) ABSTRACT

In various examples, metadata may be generated corresponding to compressed data streams that are compressed according to serial compression algorithms—such as arithmetic encoding, entropy encoding, etc.—in order to allow for parallel decompression of the compressed data. As a result, modification to the compressed data stream itself may not be required, and bandwidth and storage requirements of the system may be minimally impacted. In addition, by parallelizing the decompression, the system may benefit from faster decompression times while also reducing or entirely removing the adoption cycle for systems using the metadata for parallel decompression.

20 Claims, 10 Drawing Sheets

(56) References Cited

OTHER PUBLICATIONS

Sitaridi, E., Mueller, R., Kaldewey, T., Lohman, G., & Ross, K. A. (Aug. 2016). Massively-parallel lossless data decompression. In 2016 45th International Conference on Parallel Processing (ICPP) (pp. 242-247). IEEE.
Deutsch, P. (1996). RFC1951: DEFLATE compressed data format specification version 1.3.

* cited by examiner

200A

Original: Mississippi
Compressed: Miss<copy length 4, distance 3>ppi
4-way index
M: 3 bits
copy: 4 bits total (3 + 1)
i,s,p: 2 bits

| #outputs | #inputs | #copies | symbols |
|---|---|---|---|
| 2 | 5 | 0 | Mi |
| 2 | 4 | 0 | ss |
| 5 | 6 | 1 | <copy length 4, distance 3>p |
| 2 | 4 | 0 | pi |

Original: Mississippi
Compressed: Miss<copy length 4, distance 3>ppi
4-way index
M: 3 bits
copy: 4 bits total (3 + 1)
i,s,p: 2 bits

| outpos | inpos | copy# | symbols |
|---|---|---|---|
| 0 | 0 | 0 | Mi |
| 2 | 5 | 0 | ss |
| 4 | 9 | 0 | <copy length 4, distance 3>p |
| 9 | 15 | 1 | pi |
| 11 bytes | 19 bits | 1 copy | ←Totals |

FIGURE 2B

MississippiMississippiMiss
Block A: Mississippi
Block B: MississippiMiss
<Block A dictionary><Block A data><Block B dictionary><Block B data>

Index:
Block A base: # of input bits, # of output bytes
Block A dictionary (*32): # of input bits, symbol #
Block A data (*32): # of input bits, # of outputs bytes, # of copies
Block B base: # of input bits, # of output bytes
Block B dictionary (*32): # of input bits, symbol #
Block B data (*32): # of input bits, # of output bytes, # of copies

FIGURE 2D

Original: Mississippi Mississippi
Compressed: Miss<copy length 4, distance 3>ppi<copy length 11, distance 11>
4-way index
M: 3 bits
1st copy: 4 bits total
2nd copy: 6 bits total
i,s,p: 2 bits

| #outs | #inbits | #copies | symbols |
|---|---|---|---|
| 2 | 5 | 0 | Mi |
| 2 | 4 | 0 | ss |
| 5 | 6 | 1 | <copy length 4, distance 3>p |
| 13 | 10 | 1 | pi<copy length 11, distance 11> | copy #1: outpos=4, srcpos=1, length=4
copy #2: outpos=11, srcpos=0, length=11 (not safe to perform with #1 in parallel)

FIGURE 2E

Original: Mi:ssi:ssippiMiss
Compressed: Miss<copy length 4, distance 3>ppi<copy length 4, distance 11>
4-way index
M: 3 bits
1st copy: 4 bits total
2nd copy: 6 bits total
i,s,p: 2 bits

| #outs | #inbits | #copies | symbols |
|---|---|---|---|
| 2 | 5 | 0 | Mi |
| 2 | 4 | 0 | ss |
| 5 | 6 | 1 | <copy length 4, distance 3>p |
| 6 | 10 | 1 | pi<copy length 4, distance 11> | copy #1: outpos=4, srcpos=1, length=4
copy #2: outpos=11, srcpos=0, length=4 (safe to perform with #1 in parallel)

FIGURE 2F

PARALLEL DECOMPRESSION OF COMPRESSED DATA STREAMS

CROSS REFERENCE TO RELATED APPLICATIONS

This application is a continuation of U.S. patent application Ser. No. 17/002,564, titled "PARALLEL DECOMPRESSION OF COMPRESSED DATA STREAMS," filed Aug. 25, 2020. That application is incorporated herein by reference in its entirety.

BACKGROUND

Lossless compression algorithms have long been used to reduce the size of datasets for storage and transfer. Many traditional compression algorithms rely on a Lempel-Ziv (LZ) algorithm, Huffman encoding, or a combination thereof. As an example, the DEFLATE compression format—internet standard RFC1951—combines the LZ algorithm and Huffman encoding for use with email communications, downloading webpages, generating ZIP files for storage on a hard drive, and/or the like. Algorithms like DEFLATE may save bandwidth in data transfer and/or may preserve disk space by storing the data with less bits. However, traditional compression algorithms are inherently serial in nature due to the strong dependencies on previous inputs for reconstructing later inputs—making these compression techniques less ideal for decompression on parallel processing units, such as graphics processing units (GPUs). As a result, fine-grained parallel decompression algorithms for processing compressed data are rare.

Most conventional approaches to parallel decompression rely on modifying the compression algorithm itself in order to remove data hazards of the LZ algorithms and/or to remove or limit the Huffman encoding step. Examples of prior approaches for parallel decompression include LZ4 and LZ sort and set empty (LZSSE). These and similar approaches are able to achieve some benefits from parallel processing architectures—e.g., decreased run-time—albeit at the cost of some of the compression benefits of the LZ algorithms and/or Huffman encoding. For example, these parallel decompression algorithms often result in an increase of 10-15% in the size of the file as compared to the same files compressed under traditional sequential implementations of the DEFLATE compression format.

Another drawback of these parallel decompression algorithms is that the widespread use of the traditional file formats presents a significant hurdle to wide adoption of any new proposed format. For example, for systems where data is already stored according to a more traditional compressed format—such as using LZ algorithms, Huffman encoding, or a combination thereof—the system may need to be reconfigured to work with the new compression algorithm type. This reconfiguring may be costly, as the bandwidth and storage requirements of the system may have been optimized for the lower bandwidth and decreased file sizes of serial compression algorithms, and the increase in bandwidth and storage requirements of the parallel decompression algorithms may require additional resources. In addition, already stored data from the existing compression format may have to be reformatted and/or a new copy of the data may have to be stored in the updated format prior to removal of the existing copy—thereby further increasing the time of the adoption cycle and potentially requiring the acquisition of additional resources.

SUMMARY

Embodiments of the present disclosure relate to techniques for performing parallel decompression of compressed data streams. Systems and methods are disclosed that generate metadata for data streams compressed according to more traditional compression algorithms—such as Lempel-Ziv (LZ), Huffman encoding, a combination thereof, and/or other compression algorithms—in order to expose different types of parallelism in the data streams for parallel decompression of the compressed data. For example, the metadata may indicate demarcations in the compressed data that correspond to individual data portions or blocks of the compressed data, demarcations of data segments within each content portion, and/or demarcations of dictionary segments within each data portion or block. In addition, the metadata may indicate output locations in an output stream of data such that a decompressor—especially when decompressing in parallel—can identify where the decompressed data fits within the output stream. As such, and in contrast to conventional systems, such as those described above, the metadata associated with the compressed stream results in a more trivial—e.g., 1-2%—increase to the overall file size of the compressed data stream, without requiring any modification to the compressed data stream itself. As a result, the bandwidth and storage requirements of the system may be minimally impacted as compared to conventional parallel decompression algorithms, while also achieving the benefit of faster decompression times due to parallel processing of the compressed data. In addition, due to the compressed stream being unaffected (e.g., where a DEFLATE format is used, the compressed stream still corresponds to the DEFLATE format), issues with compatibility with older systems and files can be avoided, as systems that employ central processing units (CPUs) for decompression may ignore the metadata and serially decompress the compressed data according to conventional techniques, while systems that employ parallel processors such as GPUs for decompression may use the metadata to decompress the data in parallel.

BRIEF DESCRIPTION OF THE DRAWINGS

The present systems and methods for parallel decompression of compressed data streams are described in detail below with reference to the attached drawing figures, wherein:

FIG. 2A depicts an example table corresponding to metadata for parallel decompression of compressed data streams, in accordance with some embodiments of the present disclosure;

FIG. 2B depicts an example table corresponding to metadata in a prefix sum format for parallel decompression of compressed data streams, in accordance with some embodiments of the present disclosure;

FIG. 2D depicts an example table corresponding to metadata for parallel decompression of blocks of a compressed data stream, in accordance with some embodiments of the present disclosure;

FIG. 2E depicts an example table corresponding to copies of a compressed data stream that are not suitable for parallel processing, in accordance with some embodiments of the present disclosure;

FIG. 2F depicts an example table corresponding to copies of a compressed data stream that are suitable for parallel processing, in accordance with some embodiments of the present disclosure;

DETAILED DESCRIPTION

Systems and methods are disclosed related to parallel decompression of compressed data streams. Although primarily described herein with respect to data streams compressed using a Lempel-Ziv (LZ) algorithm and/or Huffman encoding (e.g., DEFLATE, LZ4, LZ sort and set empty (LZSSE), PKZIP, LZ Jaccard Distance (LZJD), LZ Welch (LZW), BZIP2, Finite State Entropy, etc.), this is not intended to be limiting. As such, other compression algorithms and/or techniques may be used without departing from the scope of the present disclosure. For example, Fibonacci encoding, Shannon-Fano encoding, arithmetic encoding, an artificial bee colony algorithm, a Bentley, Sleator, Tarjan, and Wei (BSTW) algorithm, prediction by partial matching (PPM), run-length encoding (RLE), entropy encoding, Rice encoding, Golomb encoding, dictionary-type encoding, and/or the like. As another example, metadata generation and parallel decompression techniques described herein may be suitable for any compressed data format that includes either a variable length of bits for encoding symbols and/or a variable output size for copies (e.g., copies may correspond to one symbol, two symbols, five symbols, etc.).

The metadata generation and decompression techniques described herein may be used in any technology space where data compression and decompression are implemented—especially for lossless compression and decompression. For example, and without limitation, the techniques described herein may be implemented for audio data, raster graphics, three-dimensional (3D) graphics, video data, cryptography, genetics and genomics, medical imaging (e.g., for compressing digital imaging and communication in medicine (DICOM) data), executables, moving data from to and from a web server, sending data between and among a central processing unit (CPU) and a graphics processing unit (GPU) (e.g., for increasing input/output (I/O) bandwidth between the CPU and GPU), data storage (e.g., to reduce the data footprint), emails, text, messaging, compressing files (e.g., ZIP files, GZIP files, etc.), and/or other technology spaces. The systems and methods described herein may be particularly well suited for amplifying storage and increasing PCIe bandwidth for I/O intensive use cases—such as communicating data between a CPU and GPU.

Figure 1:
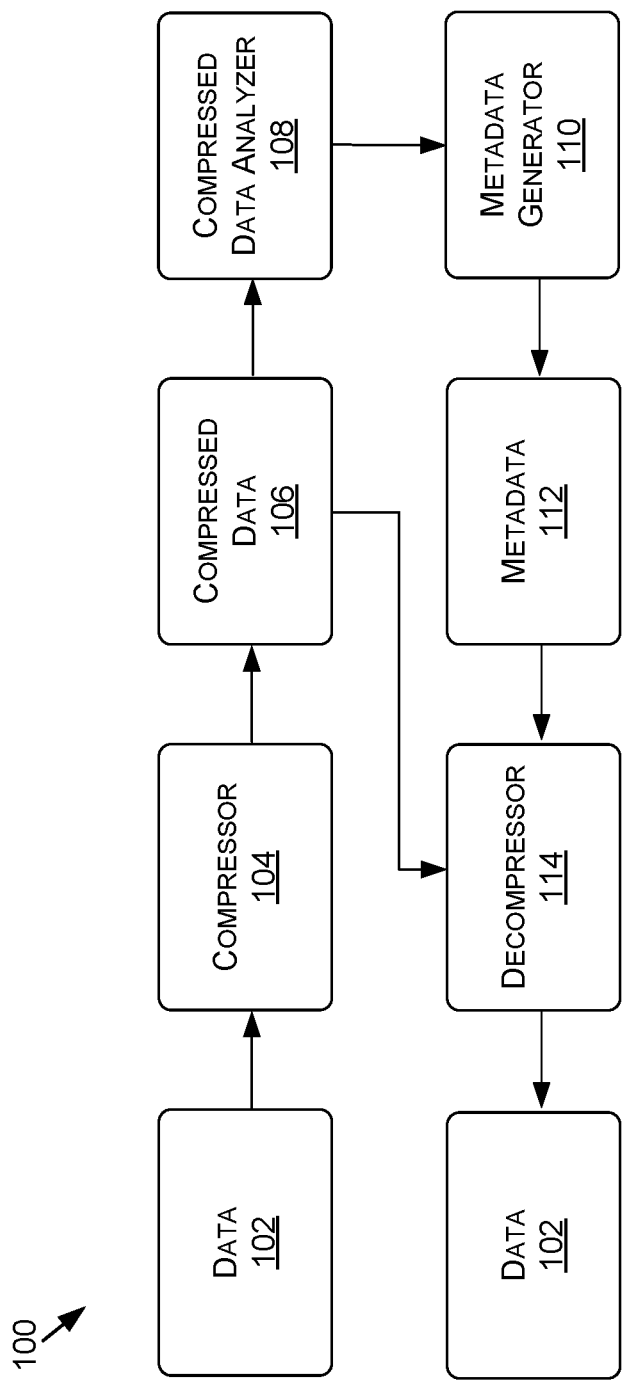
FIG. 1 depicts an example data flow diagram illustrating a process 100 for parallel decompression of compressed data streams, in accordance with some embodiments of the present disclosure.

With reference to FIG. 1, FIG. 1 is an example data flow diagram illustrating a process 100 for parallel decompression of compressed data streams, in accordance with some embodiments of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory.

The process 100 may include receiving and/or generating data 102. For example, the data 102 may correspond to any type of technology space such as but not limited to those described herein. For example, the data 102 may correspond to textual data, image data, video data, audio data, genomic sequencing data, and/or other data types, or a combination thereof. In some embodiments, the data 102 may correspond to data that is to be stored and/or transmitted using lossless compression techniques.

The process 100 may include a compressor 104 compressing the data 102 to generate compressed data 106. The data 102 may be compressed according to any compression format or algorithm, such as, but not limited to, those described herein. For example, and without limitation, the data 102 may be compressed according to the Lempel-Ziv algorithm, Huffman encoding, the DEFLATE format, and/or another compression format or technique.

A compressed data analyzer 108 may analyze the compressed data 106 to determine opportunities for parallelism therein. For example, the compressed data analyzer 108 may identify segments (or sections) within the compressed data 132 that correspond to portions of a data stream that can be processed at least partially in parallel without affecting the processing of other segments. In some embodiments, the number of segments may be the same for each block of data, or may be different (e.g., determined dynamically). The number of segments is not limited to any particular number; however, in some non-limiting embodiments, each block of compressed data may be split into 32 different segments such that 32 threads (or co-processors) of a warp on a GPU may process the 32 segments in parallel. As other non-limiting examples, the compressed data 106—or blocks thereof—may be split into 4 segments, 12 segments, 15 segments, 64 segments, etc. The number of segments may correspond to each block of data and/or to each portion of a data structure used for dictionary coding that corresponds to each block, as described herein. As such, the data structure (dictionary) may be split into a number of segments for parallel decoding and the data may be split into a (equal, in embodiments) number of segments for parallel decoding—e.g., using the already decoded dictionary.

In order to determine which portion of the compressed data 106 to associate with each segment, the compressed data analyzer 108 may execute a first pass over the compressed data 106 to determine the number of symbols or tokens within the compressed data 106. In a second pass, the number of symbols may then be used to determine how many—and which—symbols are to be included in each segment. In some embodiments, the number of symbols may be divided equally—or as equally as possible—among the segments. For example, where there are 320 symbols, and 32 segments, each segment may include 10 symbols. In other examples, the number of symbols may be adjusted—e.g., plus or minus one or more symbols for one or more of the segments—in order to simplify decompression. For example, instead of choosing 10 symbols per segment in the above example, one or more of the segments may include 11 symbols (while others may include 9) in order to cause a segment boundary to correspond to a certain byte interval—e.g., a 4 byte interval—which a decompressor 114 may handle more easily (e.g., by avoiding splitting outputs between bytes of the compressed data 106).

The segments may then be analyzed by a metadata generator 110 to generate metadata 112 corresponding to the compressed data 106 that provides information to the decompressor 114 for decompressing the compressed data 106 in parallel. For example, within each segment, the metadata 112 may identify three pieces of information. First, a bit number identifying where in the compressed data to start decoding the segment; second, a location in the output buffer the results that are decoded will be inserted; and third, the position or location within a list of copies (or matches) to start outputting the deferred copies—e.g., a copy index. For example, with respect to the third type of metadata 112, because the decoding may be executed in parallel, where an LZ algorithm is used, the decompressor 114 may not serially decode the copies, so the copies may be batched for later execution. As such, the copy index may be included in the metadata 112 to indicate to the decompressor 114 to save space in the output buffer for each copy, and may also store in a separate data array the copy index such that, once a first pass by the decompressor 114 is executed, the copies may be executed by the decompressor 114 to populate the output buffer with the data. In some embodiments, the copy window may be a set length—e.g., a sliding window. For example, where LZ77 is used, the sliding window for copies may be 32 kb, while in other algorithms, the sliding window may be a different (e.g., 16 kb, 64 kb, 128 kb, etc.) or variable size. As such, the compressed data 106 may be generated based on the sliding window size. As a result of the metadata 112, parallelism on the GPU may be executed such that each thread of the GPU may begin decoding a portion of the compressed data 106 independently from one another. In the example above using 32 segments, this process 100 may result in 32-way parallelism and each thread may decode $\frac{1}{32}^{nd}$ of the compressed data 106—or a block thereof.

In some embodiments, the metadata may correspond to the number of bits for each segment, the number of output bytes for each segment, and/or the number of copies in each segment. However, in other embodiments, a prefix sum operation may be executed on this data (e.g., the number of bits, number of output bytes, and/or the number of copies) to generate the metadata 112 in a prefix sum format. As a result, the metadata 112 may correspond to the input (bit, nibble, byte, etc.) location for each segment (e.g., as determined using the number of bits, nibbles, or bytes for each prior segment), the output (bit, nibble, byte, etc.) location for each segment (e.g., as determined using the number of output bits, nibbles, or bytes from the prior segments), and the number of copies that are included in each segment prior to the current segment the metadata 112 is being generated for. An example of the difference between these two formats of the metadata is illustrated in FIGS. 2A and 2B, as described in further detail herein. In some embodiments, due to the values of the input bit, output position, and/or the copy index for each segment increasing monotonically, the metadata 112 may be compressed by storing common offsets (shared by all segments) and differences between the input bit, output position, and copy index in each segment.

As described herein, the compressed data analyzer 108 may analyze the compressed data 106 to determine the metadata 112 corresponding to content portion of the compressed data 106, but may also analyze the compressed data 106 to determine metadata 112 corresponding to a dictionary portion (where present) corresponding to the compressed data 106 and/or to determine metadata 112 corresponding to identifying blocks within a larger stream of compressed data 106. As an example, the content portion of the compressed data 106 may require a dictionary in order to be decoded properly by the decompressor 114. The dictionary may include a representation of a Huffman tree (or matching tree) in embodiments where Huffman encoding is used. In some embodiments, such as where LZ algorithm and Huffman encoding are both used (e.g., in the DEFLATE format), a first Huffman encoding operation may be executed on the literals and the lengths of copies, and a second Huffman encoding operation may be executed on the distances. As such, two or more Huffman trees may be included within the dictionary for decoding each of the literals and the lengths and distances of the copies.

In other embodiments, the dictionary may provide an indication as to what symbols the compressed data 106 corresponds to—or bit values corresponding thereto—such that the decompressor 114 may use the dictionary to decompress the content portion of the compressed data 106. In some embodiments, the dictionary may be Huffman encoded and may also correspond to a Huffman tree for decompressing the compressed data 106. Where a dictionary is used, such as in the DEFLATE format, for each block of the compressed data 106, the metadata generator 110 may generate metadata 112 corresponding to a starting input bit of each segment of the dictionary and a number of bits used for each symbol in the content portion of the block of the compressed data 106 that the dictionary corresponds to. As such, the dictionary may be divided into segments based on the metadata 112 and processed in parallel using threads of the GPU. As described herein, the number of segments may be similar to the number of segments of the data or content portion of the block of the compressed data 106, or may be different, depending on the embodiment. In addition, the dictionary may include fills or repeats, similar to that of the copies or matches of the data segment of the compressed data 106, and the fills or repeats may be used to further compress the dictionary.

The compressed data 106 may be split into any number of blocks based on any number of criteria as determined by the compressor 104 and/or according to the compression format or algorithm being used. For example, a first block and a second block may be created where the frequencies or priorities in the compressed data 106 change. As a non-limiting example, the letters A, e, and i may be most frequent for a first portion of the compressed data 106, and the letters g, F, and k may be most frequent for a second portion of the compressed data 106. As such, according to the particular compression algorithm used, the first portion may be separated into a first block and the second portion may be separated into a second block. There may be any number of blocks determined by the compressor 104 for the compressed data 106. The compressed data analyzer 108 may analyze these blocks to determine locations of the blocks within the larger stream of the compressed data 106. As such, the metadata generator 110 may generate metadata 112 that identifies a starting input bit and an output byte (e.g., a first output byte location of the decoded data) of each block of the compressed data 106—which may include uncompressed blocks. As a result of the blocks being separate from one another, and separately identified by the metadata 112, the blocks may also be processed in parallel—e.g., in addition to the compressed data 106 within each of the blocks being processed in parallel. For example, where each block includes 32 segments, the first block may be executed using a first warp of a GPU and the second block may be executed using a second warp of the GPU in parallel with the first block. In an example where one or more of the blocks are uncompressed, the uncompressed blocks may be transmitted with no dictionary, and the input bit and output byte of the uncompressed block may be used by the decompressor 114 to directly copy the data to the output.

As a result, the metadata 112 may correspond to input and output locations for each block within a larger stream, an input location for the dictionary within each block as well as bit values for each symbol of the dictionary, and input locations, output locations, and copy indexes for each segment within each block. This metadata 112 may be used by the decompressor 114 to decode or decompress the compressed data 106 with various forms of parallelism. For example, as described herein, the individual blocks may be decoded in parallel—e.g., using different GPU resources and/or parallel processing units. In addition, within each (parallel decompressed) block, the dictionary (where existent) may be divided into segments and the segments may be decoded or decompressed in parallel (e.g., where there are 64 segments of the dictionary, all 64 segments may be decoded in parallel, such as by using 64 different threads, or two warps, of a GPU). Further, within each (parallel decompressed) block, the content portion of the block may be divided into segments and the segments may be decoded or decompressed in parallel. Further, as defined herein, one or more of the copy or match operations may be executed in parallel by the decompressor 114—e.g., where a copy relies on data that has been decoded into the output stream, the copy may be performed in parallel with one or more other copies. In addition, each individual copy operation may be executed in parallel. For example, where a copy has a length of greater than one, the copy of each symbol or character of the full copy may be executed in parallel by the decompressor 114—e.g., with respect to FIG. 2F, each character of "issi" may be executed in parallel (e.g., copy "i" on a first thread, "s" on a second thread, "s" on a third thread" and "i" on a fourth thread of a GPU to generate the respective output bytes for the output stream).

The decompressor 114 may receive the compressed data 106 and the metadata 112 associated therewith. The decompressor 114 may use the metadata 112 to separate the compressed data 106 into separate blocks (where there is more than one block). For example, the decompressor 114 may analyze the metadata 112 corresponding to the block level of the compressed data 106 and may determine the input (bit, nibble, byte, etc.) location of each block (e.g., the first bit or the compressed data 106 that corresponds to the block) and the output (bit, nibble, byte, etc.) location for each block (e.g., the first output location in the output stream where the data—after decompression—from the block is located). After each block is identified, the decompressor 114 may process each block in serial (e.g., a first block may be processed, then a second block, and so on), may assign two or more of the blocks for parallel decompression by different GPU resources (e.g., by assigning a first block to a first GPU or a first group of threads thereof and assigning a second block to a second GPU or a second group of threads of the first GPU, and so on), or a combination thereof. Each block may correspond to a different type or mode, in some embodiments, such as an uncompressed mode block, a fixed code table mode block, a generated code table mode block, and/or other types. The decompressor 114 may decompress the compressed data 106 (and/or decode the uncompressed data when in uncompressed mode) based on the mode, and the metadata 112 may differ based on the mode. For example, in an uncompressed mode, there may no dictionary as the data does not need to be decompressed and/or there may be no copies or matches. As such, the metadata may only indicate an input location and an output location for the data such that the input data stream corresponding to the uncompressed block is copied directly to the output stream.

The decompressor 114 may decompress each block of data using the metadata 112 associated with the dictionary(ies) and the content portion(s) of the block. For example, for each block, the metadata 112 may identify the input (bit, nibble, byte, etc.) location of the dictionary(ies) and bit values (or number of bits) for each symbol of every segment of the data in the block. As described herein, the dictionary may be used by the decompressor 114 to decompress the content portion of the block accurately. The dictionary may be generated using Huffman encoding on the content portion of the block and, in some embodiments, the compressed data corresponding to the dictionary may also be Huffman encoded. As a result, the dictionary portion of the compressed data may be compressed using Huffman encoding and the content portion of the compressed data may be Huffman encoded, in embodiments. The metadata 112 corresponding to the dictionary portion of the compressed data 106 within each block may indicate the input locations of the segments of the dictionary. For example, where the dictionary is divided into 32 segments, the metadata 112 may indicate a starting input bit (and/or output byte or other location) of each segment of the dictionary. As such, the decompressor 114 may use the metadata 112 to decompress or decode the dictionary portion of the compressed data 106 in parallel (e.g., one segment per thread of the GPU). The dictionary may be compressed according to an LZ algorithm (in addition to using Huffman encoding, in embodiments) and, as a result, the decompression of the dictionary portion of the compressed data 106 may include copies or fills. As such, where parallel decompression of the dictionary is executed, a first pass by the decompressor 114 may decode the actual bit values (e.g., corresponding to a bit length of each symbol in the dictionary) and leave a placeholder for the to-be-copied or filled bit values. During a second pass, the decompressor 114 may execute the fill or copy operation to fill in the missing bit values corresponding to symbols of the dictionary (e.g., as described in more detail herein with respect to FIG. 2C).

The decompressor 114 may use the metadata 112 corresponding to the content portion of the compressed data 106 for each block to identify the first input location (e.g., bit, nibble, byte, etc.) of each segment of the compressed data 106, the output location in the output stream for each segment of the compressed data 106 after decompression, and/or the copy index or number of copies for each segment of the compressed data 106. A prefix sum operation may be executed by the decompressor 114 to determine the input location, output locations, and number of copies for each segment. However, in other embodiments, as described herein, instead of using a prefix sum format to identify input locations, output locations, and the copy index, the metadata 112 may instead indicate the number of bits in each segment, the number of output bytes in each segment, and the number of copies in each segment. The decompressor 114 may decompress identified segments of the compressed data 106 in parallel. For example, using the identifiers from the metadata 112, the decompressor 114 may assign chunks or portions of the compressed data 106 corresponding to segments to different threads of a GPU. A first pass by the decompressor 114 through each segment of the compressed data 106 may be executed to output decompressed literals (e.g., actual symbols) from the compressed data 106 directly to the output stream (e.g., at location identified by the metadata) and to store the copy or match information in a separate queue for later processing (e.g., in a second pass by the decompressor 114) while preserving space in the output stream for the copies. The amount of space preserved in the output stream may be determined using the metadata 112. These queued copies or matches may be referred to herein as deferred copies.

After the deferred copies are queued and placeholders in the output stream are created, the decompressor 114 may execute a second pass through the deferred copies. One or more of the copies may be executed in parallel, depending on whether each copy is determined safe to copy (e.g., if the data that is to be copied has been decompressed already, or does not rely on another copy that has yet to be copied, the copy may be determined to be safe). For example, the decompressor 114 may look forward in the sequence of copies to find additional copies that may be performed in parallel. The ability to process copies in parallel may be determined using the metadata 112 and/or information corresponding to the copies. For example, an output position of the copy within the output stream (as determined from the metadata 112), a source position from which the copy is to be made (as determined from the encoded distance information corresponding to the copy), and/or a length of the copy (as determined from the encoded length information corresponding to the copy) may be used to determine whether a copy is safe or not for parallel processing with one or more other copies. A copy may be safe to execute in parallel with another copy when the source ends before the current output cursor and the copy does not overlap itself. As an example, and based on experimentation, the number of bytes copied simultaneously may be increased from 3-4 to 90-100, or more. This process affords significant additional opportunities for parallelism both across threads and for memory system parallelism within a single thread. As such, one or more of the copies (e.g., intra-block copies or inter-block copies) may be executed in parallel with one or more other copies. Examples of safe and unsafe copies for parallel execution are described with respect to FIGS. 2E-2F. In addition, in some embodiments, symbols within a single copy may be executed in parallel. For example, where a copy has a length greater than one, the individual symbols within the copy may be copied to (bytes of) the output stream in parallel using two or more threads (or co-processors) of a GPU.

As a result, the decompressor 114 may output each of the symbols to the output stream by executing a first pass of the compressed data 106 to output the literals, and a second pass of the copies to output the symbols from the copies. The result may be an output stream corresponding to the data 102 that was originally compressed by the compressor 104. In examples where lossless compression techniques are used, the data 102 output may be identical or substantially identical to the data 102 input the compressor 104.

In some embodiments, a binary tree search algorithm with a shared memory table may be executed on the compressed data 106 to avoid divergence across threads that would occur with the typical fast path/slow path implementations found in CPU-based decoders or decompressors. For example, in conventional implementations on a CPU, a large array of data may be used to decode some number of bits at a time. With respect to the DEFLATE format, each symbol may range from 1 to 15 bits long, so when decoding the data it may not be immediately obvious to the decompressor as to how long each symbol is. As a result, CPU decompressors take one bit to see if it's a length 1 symbol, then take another bit to see if it's a length 2 symbol, and so on, until an actual number of bits corresponding to a symbol is determined. This task may be time consuming and may slow down the decompress process even for CPU implementations. As a result, some approaches have implemented an approach to analyze multiple bits at a time, such as 15 bits. In such embodiments, 15 bits may be pulled from the compressed data stream and a look up table may be used to determine which symbol the data corresponds to. However, this process is wasteful because the sliding window may only be 32 kb but the system has to store 15 bits for analysis even where a symbol may only be compressed into 2 bits. As a result, in some implementations, a fast path/slow path method may be used where 8 bits are extracted, a symbol lookup is performed for the 8 bits, and when the symbol is shorter than 8 bits the fast path is used and when the symbol is greater than 8 bits the slow path is used to determine what symbol is represented by the data. This process is also time consuming, and reduces the runtime of the system for decompressing the compressed data 106.

On a GPU(s), instead of using a fast pass/slow path method, where some number of threads (e.g., 32) are executing on some number of symbols (e.g., 32), some will hit the fast path and some will hit the fast path, mixed together in a warp (e.g., where there are 32 segments), which is inefficient. To combat this issue, a binary search algorithm may be used to improve efficiency. For example, the binary search may be executed on a small table, such as a table that is 15 entries long, to determine which symbols the table belongs to. Due to the decreased size of the array, the array may be stored in shared memory on the chip which may result in fast lookup on a GPU. In addition, using a binary search algorithm may allow all the threads to execute the same code even if looking at different portions of the array in shared memory. As a result, memory traffic may be reduced as a binary search may look at a length 8 symbol to see if the symbol is longer than 8 bits or shorter than 8 bits. In addition, the one or more (e.g., two) of the top levels of the binary tree may be cached in data registers to reduce the number of shared memory accessed per lookup (e.g., from 5 to 3). As a result, the first of four accesses may always be the same one, such that, rather than loading out of memory each time, a register may be kept live on the GPU. The next may be 4 or 12, and instead of having another level of memory access, the system may choose whether it is looking at the symbol 4 register or symbol 12 register, and this may reduce the total number of accessed by 2 or more (e.g., usually 4 for binary search to get length and one more to get the actual symbol, so this process reduces from 4 plus 1 to 2 plus 1). As such, instead of loading an entry and then shifting the symbol to compare against, the symbol itself is pre-shifted.

In addition, in some embodiments, the input stream of compressed data 106 may be swizzled or interleaved. For example, because a block of the compressed data 106 may be divided into some number of segments (e.g., 32) by the compressed data analyzer 108, each thread may be reading from a distant part of the stream. As a result, the input stream may be interleaved at the segment boundaries (e.g., using the metadata 112) in a pre-process to improve data read locality. For example, where the data 102 corresponds to an actual dictionary including all of the words of a particular language, one thread may read from the words starting with the letter "A," another from the letter "D," another from the letter "P," and so on. To remedy this issue, the data may be reformatted such that all threads may read from adjacent memory. For example, the compressed data 106 may be interleaved using information from an index such that each thread may read from similar cache lines. As such, the data may be shuffled together so that when threads are processing the data they may have some similarity in the data even though the data is different. With a playing card example, the swizzling or interleaving of the data may allow each thread to process cards with the same numbers or characters even if of a different suit.

As a further example, such as where the segments are processed using threads of a warp of a GPU, a warp-synchronous data parallel loop may be executed to load and process the dictionary. For example, using an index and a data parallel algorithm, the system may instruct the dictionary entries in parallel. When processing in series, the system may look at how many symbols are length 2, length 3, and so on. However, instead of performing these calculations serially, the system may execute a data algorithm to—in parallel—calculate or assign a thread to each symbol, then report whether the symbols are of a particular length, and then execute a warp reduction to the total number of warps. For example, where 286 symbols are to be analyzed (e.g., 0-255 bytes, 256 end of block, 257-286 for different lengths), each of the 286 symbols may be analyzed in parallel.

Now referring to FIGS. 2A-2F, each of the examples described may correspond to data compressed according to the DEFLATE compression format, and metadata 112 corresponding to the same. However, this is for example purposes only and, as described herein, the techniques of the present disclosure may be implemented for, or applied to, any type of data compression format, such as but not limited to those described herein.

FIG. 2A depicts an example table 200A corresponding to metadata 112 for parallel decompression of compressed data streams, in accordance with some embodiments of the present disclosure. For example, the data 102 (or a portion thereof, such as a block thereof) may correspond to the word "Mississippi." The compressor 104 may compress the data 102 according to the DEFLATE compression algorithm to generate a compressed version of the data 102 (e.g., the compressed data 106) represented as "Miss<copy length 4, distance 3>ppi." In addition, the compressed data 106 may be Huffman encoded, and as a result the various symbols may be represented by a number of bits corresponding to some priority or frequency evaluation by the compressor 104. For a non-limiting example, "M" may be represented by 3 bits, the copy may be represented by 4 bits (e.g., 3 bits for length and 1 bit for distance), and "i," "s," and "p" may each be represented by 2 bits in the compressed data 106. Assuming, for this example, that blocks of the compressed data 106 are broken down into four segments (e.g., a 4-way index), the compressed data analyzer 108 may analyze the compressed data 106 to determine a first segment to include "Mi," a second segment to include "ss," a third segment to include the copy and "p," and a fourth segment to include "p." For example, the eleven character or symbol "Mississippi" may be broken down into eight symbols (e.g., seven literals and one copy), and the segments may be generated to be of substantially equal size. However, the fourth segment may only include one symbol due to the odd number of symbols. The compressed data analyzer 108 may then determine the number of outputs (or output bytes) for each segment, the number of inputs (or input bits) for each segment, and/or the number of copies in each segment. In some examples, the metadata generator 110 may use this information directly to generate the metadata 112. However, in other examples, a prefix sum operation may be executed on this data to generate metadata 112 according to table 200B.

With respect to FIG. 2B, FIG. 2B depicts an example table 200B corresponding to metadata 112 in a prefix sum format for parallel decompression of compressed data streams, in accordance with some embodiments of the present disclosure. For example, instead of a number of outputs, each segment may instead be identified by the output position within the output stream to indicate to the decompressor 114 where the output from the decompressed symbols from the segment should begin. Instead of a number of inputs, the input position within the compressed data stream may be identified to indicate to the decompressor 114 where to begin decompressing the segment, such that the segment may be assigned to a unique thread of the GPU for parallel processing. In addition, instead of a number of copies in each segment, a running total of copies from prior segments of the block may be identified in the metadata 112 to indicate to the decompressor which copy corresponds to each deferred copy in the queue. Ultimately, in this example, the prefix sum format of the metadata 112 may indicate to the decompressor 114 that, within the content portion of the current block (or data portion) of compressed data, there are 11 bytes of output, 19 bits of input, and one copy, and may indicate where each segment begins in the compressed data 106, where to output each segment, and/or the copy index.

Figure 2C:
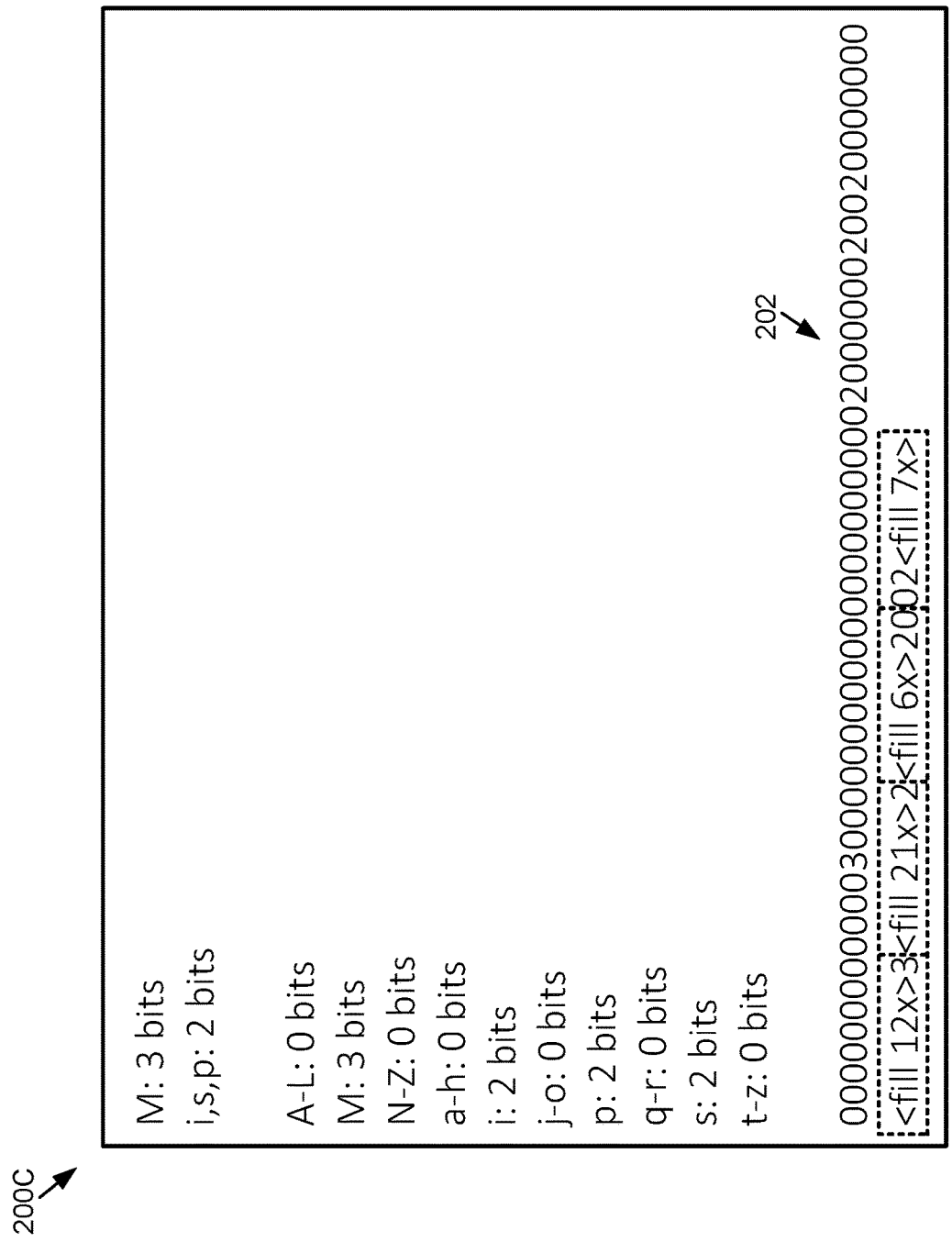
FIG. 2C depicts an example table corresponding to a dictionary and metadata associated with the same, in accordance with some embodiments of the present disclosure.

With reference to FIG. 2C, FIG. 2C depicts an example table 200C corresponding to a dictionary and metadata 112 associated with the same, in accordance with some embodiments of the present disclosure. For example, using the same number of bits for the symbols as described herein with respect to FIGS. 2A and 2B (e.g., as determined using Huffman encoding), the dictionary may be generated to indicate these values. In this example, the dictionary may correspond to lowercase and uppercase letters of the English alphabet. However, this is not intended to be limiting, and the dictionary may correspond to any types of symbols including characters from any language, numbers, symbols (e.g., !, $, *, ^, and/or other symbol types), etc. As such, because the compressed data 106 may only correspond to M, i, s, and p, the dictionary portion of the compressed data 106 may be compressed to indicate these values. In such an example, data string 202 may represent the data 102 corresponding to the dictionary, where each of the 52 characters (e.g., A-Z and a-z) are represented by a value corresponding to a number of bits. To further compress the dictionary, the compressor 104 may generate fill or copy symbols corresponding to repeated values from the data string 202. In this case, the repeated values are the 0's, so the compressed data 106 corresponding to the dictionary may be represented by "<fill 12x>3<fill 21x>2<fill 6x>2002<fill 7x>." The compressed data analyzer 108 may analyze the compressed data 106 corresponding to the dictionary and determine segment breaks (e.g., in the example where four segments are used, the compressed data 106 may be split into 4 segments). The split of the four segments is indicated by the dashed lines. The metadata generator 110 may then analyze the segment information to generate the metadata 112 corresponding to the dictionary portion of the block of the compressed data 106—e.g., to indicate the starting input location and symbol number or index of every segment in the dictionary.

With reference now to FIG. 2D, FIG. 2D depicts an example table 200D corresponding to metadata 112 for parallel decompression of blocks of a compressed data stream, in accordance with some embodiments of the present disclosure. For example, assuming the data 102 was "MississippiMississippiMiss," the compressor 104 may separate the data 102 into two blocks for compression: a first block corresponding to "Mississippi;" and a second block corresponding to "MississippiMiss." As such, to identify the locations of the different blocks within the compressed data 106—and the dictionaries corresponding thereto—the compressed data analyzer 108 may analyze the compressed data 106 to determine the initial input location (e.g., a first input bit, nibble, byte, etc.) of each block of the compressed data 106 and/or the initial output location (e.g., a first bit, nibble, byte, etc.) of each block in the output stream. As a result, the metadata 112 corresponding to a stream of compressed data 106 may indicate a number of inputs (e.g., bits, nibbles, bytes, etc.) and a number of outputs (e.g., bits, nibbles, bytes, etc.) for each block of the compressed data 106, a number of inputs (e.g., bits, nibbles, bytes, etc.) and a symbol number for each segment within each block, and/or a number of inputs (e.g., bits, nibbles, bytes, etc.), a number of outputs (e.g., bits, nibbles, bytes, etc.), and a number of copies for each segment within each block. Where a prefix sum operation is executed, the metadata 112 may instead include the initial input location and initial output location of each block of the compressed data, an initial input location and symbol index for each segment of the dictionary portion for each block, and/or an initial input location, an initial output location, and a copy index for each segment of the content portion for each block (or data portion). In further embodiments, some combination of the two different metadata formats may be used such that metadata for one or more of the blocks, dictionaries, or data are in prefix sum format while one or more of the blocks, dictionaries, or data are not in prefix sum format.

The metadata 112 may then be used by the decompressor 114 to decompress the compressed data 106. For example, each block of the compressed data 106 may be identified using the metadata 112 such that two or more blocks of the compressed data 106 may be decompressed in parallel—e.g., block A and block B. For each block, the metadata 112 may be used to determine the segments of the dictionary such that the dictionary may be decompressed in parallel—e.g., one segment per thread or co-processor. The dictionary may then be used to decompress the content portion of the compressed stream. For example, the metadata 112 may indicate the segments of the content portion of the compressed data 106, and the decompressor 114 may use the dictionary to decode the literals from the compressed data 106, and to output the literals to the output stream. The decompressor 114 may further use the metadata 112 and the copy information encoded in the compressed data 106 to reserve portions of the output stream for copies and to populate a queue or data structure with information about each copy (e.g., a source location, a distance, a length, etc.). As described herein, the segments of the content portion of the compressed data 106 may be decompressed in parallel. After decompression, the decompressor 114 may execute the copy operations on the deferred copies in the queue to populate the reserved placeholders in the output stream with the corresponding copied symbols. As an example, and with respect to FIG. 2A, the copy of "issi" indicated by a source position of 1, a copy length of 4, and a distance of 3 may be used to copy "i" to position 4, "s" to position 5, "s" to position 6, and "i" to position 6. The "i" at position 6 may be referred to as an overlap copy as the "i" at position 6 is copied from the "i" at position 4 which did not exist until the copy began. As described herein, the individual copy operation may be executed in parallel, in some embodiments, such that two or more of the "issi" copies may be executed in parallel using different threads of the GPU.

In addition, in some embodiments, separate copies may be executed in parallel when the copies are determined to be safe. For example, with reference to FIG. 2E, FIG. 2E depicts an example table 400E corresponding to copies of a compressed data stream that are not suitable for parallel processing, in accordance with some embodiments of the present disclosure. For example, where the compressed data 106 corresponds to "MississippiMississippi," the compressed data 106 may include two copies (e.g., copy #1 and copy #2 as indicated in the table 200E). In this example, the decompressor 114 may, when about to execute or during execution of the first copy, determine whether one or more additional copies—e.g., the second copy—may be executed in parallel. The decompressor 114 may look at the source position of the second copy and the output position of the first copy to determine if there is overlap. In this case, because the second copy relies on the output from the first copy, the second copy may not be safe to perform in parallel with the first copy. As such, the first copy and the second copy may be executed sequentially.

As another example, and with reference to FIG. 2F, FIG. 2F depicts an example table 400F corresponding to copies of a compressed data stream that are suitable for parallel processing, in accordance with some embodiments of the present disclosure. For example, where the compressed data 106 corresponds to "MississippiMiss," the compressed data 106 may include two copies (e.g., copy #1 and copy #2 as indicated in the table 200F). In this example, the decompressor 114 may, when about to execute or during execution of the first copy, determine whether one or more additional copies—e.g., the second copy—may be executed in parallel. The decompressor 114 may look at the source position of the second copy and the output position of the first copy to determine if there is overlap. In this case, because the second copy does not rely on the output from the first copy (e.g., because the second copy can be executed without requiring results from the first copy to be populated in the output buffer), the second copy may be safe to perform in parallel with the first copy. As such, the first copy and the second copy may be executed in parallel, thereby providing outputs of 8 symbols at one time instead of 4 and 4 sequentially.

Figure 3:
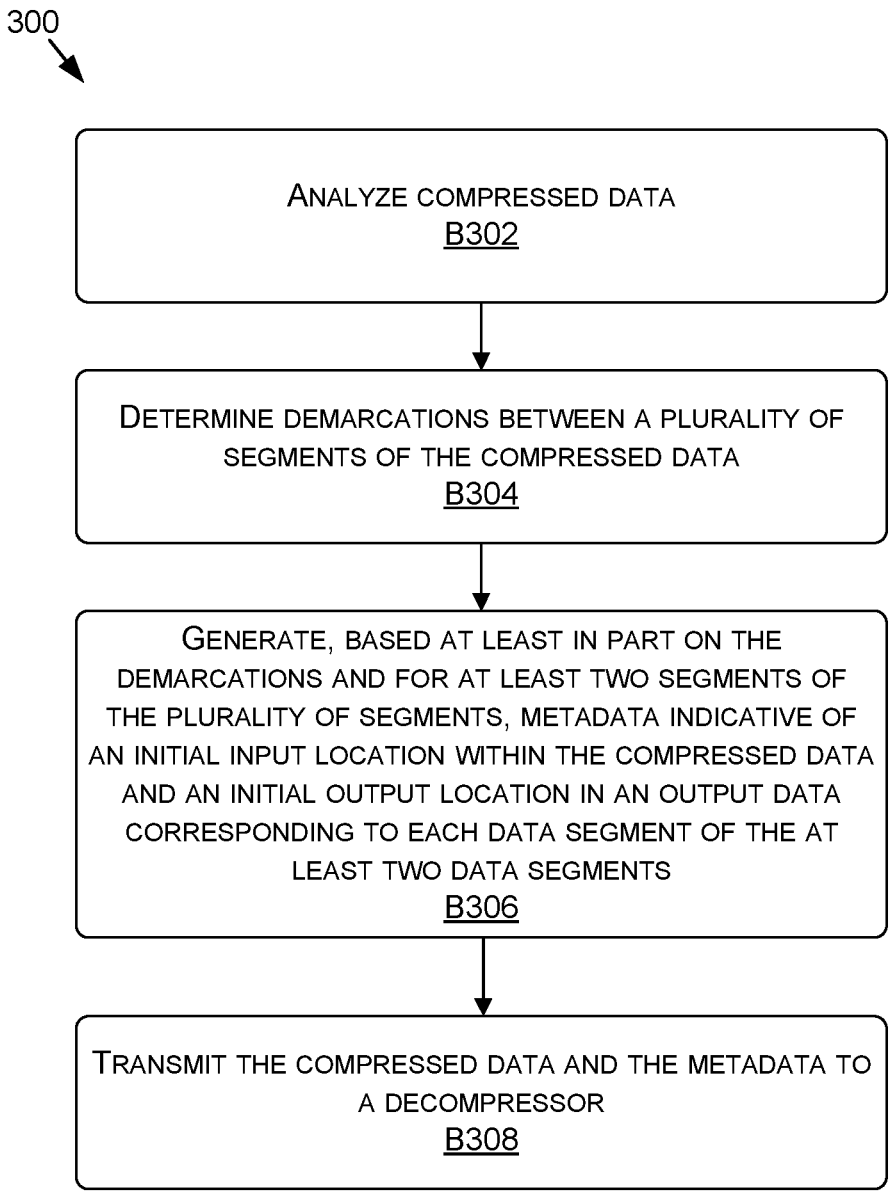
FIG. 3 depicts a flow diagram corresponding to a method for generating metadata for a compressed data stream for parallel decompression of the compressed data stream, in accordance with some embodiments of the present disclosure.
Figure 4:
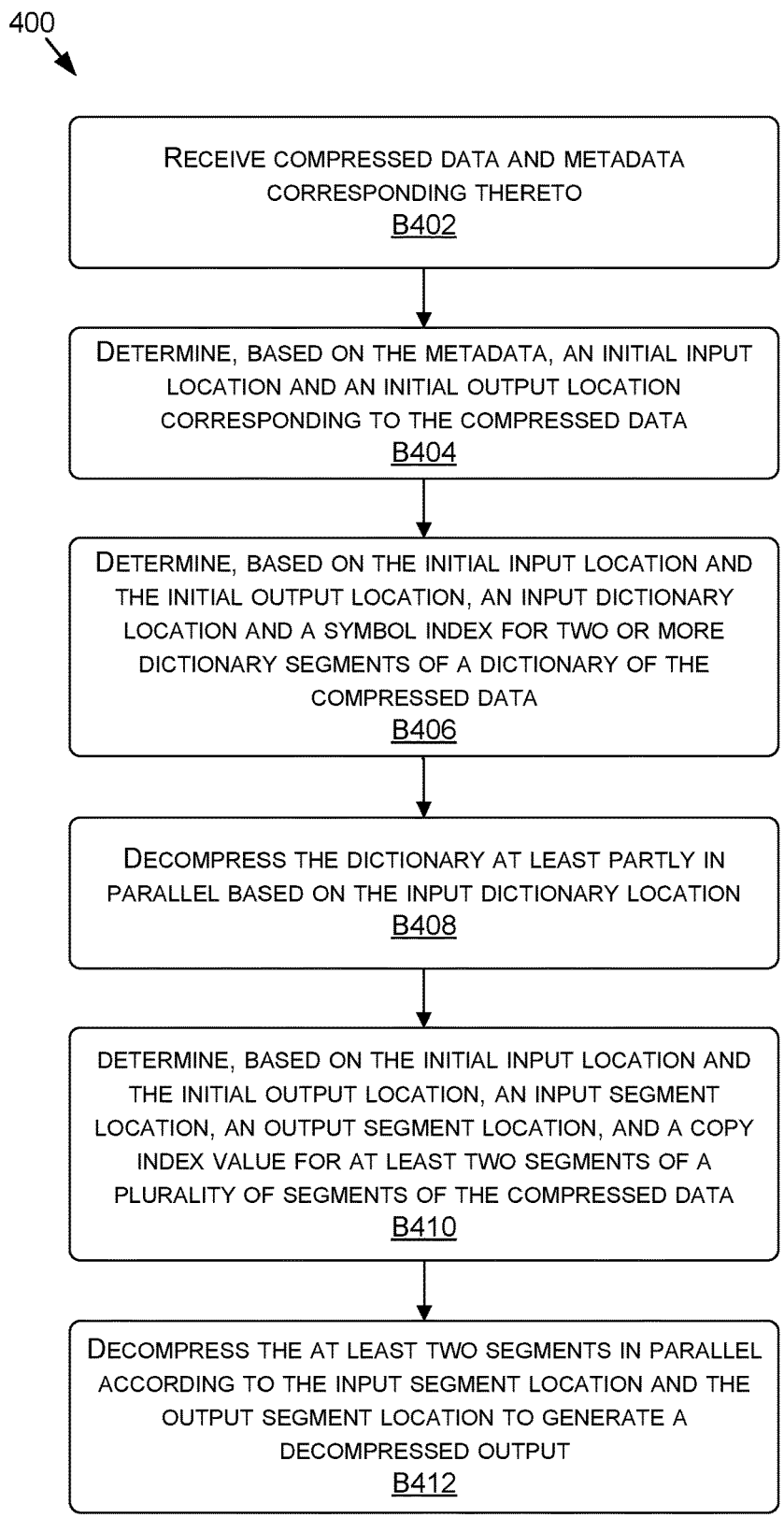
FIG. 4 depicts a flow diagram corresponding to a method for decompressing a compressed data stream in parallel, in accordance with some embodiments of the present disclosure.

Now referring to FIGS. 3-4, each block of methods 300 and 400, described herein, comprises a computing process that may be performed using any combination of hardware, firmware, and/or software. For instance, various functions may be carried out by a processor(s) executing instructions stored in memory. The methods 300 and 400 may also be embodied as computer-usable instructions stored on computer storage media. The methods 300 and 400 may be provided by a standalone application, a service or hosted service (standalone or in combination with another hosted service), or a plug-in to another product, to name a few. In addition, methods 300 and 400 are described, by way of example, with respect to the process 100 of FIG. 1. However, these methods 300 and 400 may additionally or alternatively be executed within any one process by any one system, or any combination of processes and systems, including, but not limited to, those described herein.

With reference to FIG. 3, FIG. 3 depicts a flow diagram corresponding to a method 300 for generating metadata for a compressed data stream for parallel decompression of the compressed data stream, in accordance with some embodiments of the present disclosure. The method 300, at block B302, includes analyzing compressed data. For example, the compressed data analyzer 108 may analyze the compressed data 106.

The method 300, at block B304, includes determining demarcations between a plurality of segments of the compressed data. For example, the compressed data analyzer 108 may determine demarcations between segments of the compressed data 106.

The method 300, at block B306, includes generating, based at least in part on the demarcations and for at least two segments of the plurality of segments, metadata indicative of an initial input location within the compressed data and an initial output location in an output data corresponding to each data segment of the at least two data segments. For example, the metadata generator 110 may generate the metadata 112 corresponding to the segments to identify the initial input locations, the initial output locations, and/or the copy index for some or all of the segments of the content portion of each block of the compressed data 106.

The method 300, at block B308, includes transmitting the compressed data and the metadata to a decompressor. For example, the compressed data 106 and the metadata 112 may be used by the decompressor 114 to decompress the compressed data 106 at least partly in parallel.

Now referring to FIG. 4, FIG. 4 depicts a flow diagram corresponding to a method 400 for decompressing a compressed data stream in parallel, in accordance with some embodiments of the present disclosure. The method 400, at block B402, includes receiving compressed data and metadata corresponding thereto. For example, the decompressor 114 may receive the compressed data 106 and the metadata 112.

The method 400, at block B404, includes determining, based on the metadata, an initial input location and an initial output location corresponding to the compressed data. For example, the metadata 112 may indicate an initial input location in the compressed data 106 and an initial output location in the output data stream corresponding to each block of the compressed data 106.

The method 400, at block B406, includes determining, based on the initial input location and the initial output location, an input dictionary location and a symbol index for two or more dictionary segments of a dictionary of the compressed data. For example, the metadata 112 may indicate an initial input location and a symbol index for segments of the dictionary corresponding to the compressed data 106.

The method 400, at block B408, includes decompressing the dictionary at least partly in parallel based on the input dictionary location. For example, the metadata 112 may indicate the segments of the dictionary, and this information may be used by the decompressor 114 to process each segment of the dictionary in parallel using threads of a GPU.

The method 400, at block B410, includes determining, based on the initial input location and the initial output location, an input segment location, an output segment location, and a copy index value for at least two segments of a plurality of segments of the compressed data. For example, the decompressor 114 may use the metadata 112 to determine the initial input location in the compressed data 106, initial output location in the output stream, and the copy index (e.g., number of copies in the segments prior to the current segment) for each segment of the compressed data 106 in a block or data portion.

The method 400, at block B412, includes decompressing the at least two segments in parallel according to the input segment location and the output segment location to generate a decompressed output. For example, the decompressor 114 may use the metadata 112 and the dictionary to generate the data 102 from the compressed data 106. As such, once the data 102 has been recovered, the data 102 may be used on the receiving end to perform one or more operations. For example, where the data 102 was compressed and passed to the GPU from a CPU for parallel processing, the data may then be passed back to the CPU. Where the data 102 correspond to text, messaging, or email, the data may be displayed on a device—e.g., a user or client device. Where the data 102 corresponds to a video, audio, image, etc., the data may be output using a display, a speaker, a headset, an ear piece, etc. Where the data 102 corresponds to a web site, the web site may be displayed within a browser on the receiving device—e.g., the user or client device. As such, the decompressed data may be used in any of a variety of ways and, due to the parallel decompression, may be available faster while using less memory resources as compared to conventional approaches.

Example Computing Device

Figure 5:
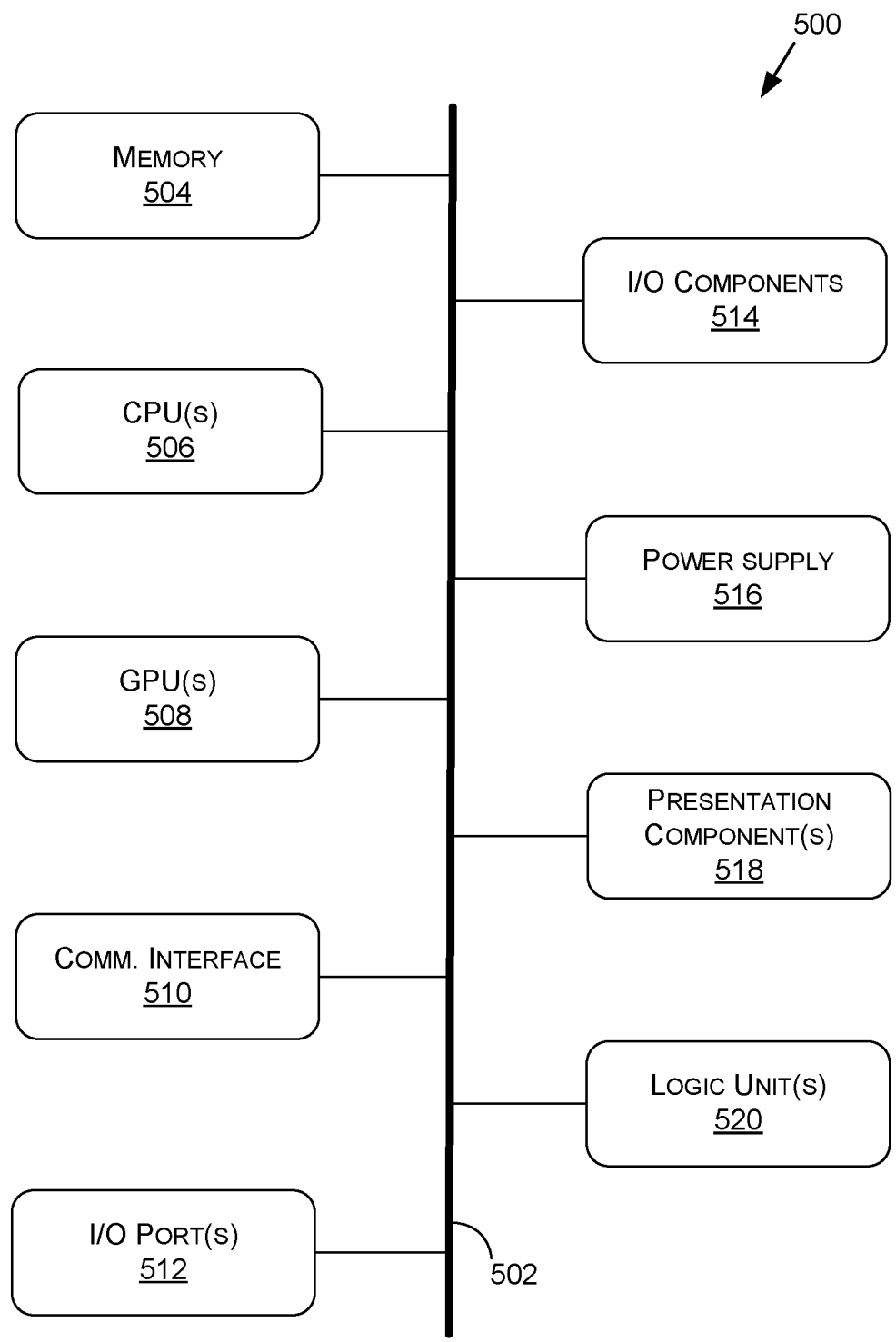
FIG. 5 depicts a block diagram of an example computing device suitable for use in implementing some embodiments of the present disclosure.

FIG. 5 is a block diagram of an example computing device(s) 500 suitable for use in implementing some embodiments of the present disclosure. Computing device 500 may include an interconnect system 502 that directly or indirectly couples the following devices: memory 504, one or more central processing units (CPUs) 506, one or more graphics processing units (GPUs) 508, a communication interface 510, input/output (I/O) ports 512, input/output components 514, a power supply 516, one or more presentation components 518 (e.g., display(s)), and one or more logic units 520. In at least one embodiment, the computing device(s) 500 may comprise one or more virtual machines (VMs), and/or any of the components thereof may comprise virtual components (e.g., virtual hardware components). For non-limiting examples, one or more of the GPUs 508 may comprise one or more vGPUs, one or more of the CPUs 506 may comprise one or more vCPUs, and/or one or more of the logic units 520 may comprise one or more virtual logic units. As such, a computing device(s) 500 may include discrete components (e.g., a full GPU dedicated to the computing device 500), virtual components (e.g., a portion of a GPU dedicated to the computing device 500), or a combination thereof.

Although the various blocks of FIG. 5 are shown as connected via the interconnect system 502 with lines, this is not intended to be limiting and is for clarity only. For example, in some embodiments, a presentation component 518, such as a display device, may be considered an I/O component 514 (e.g., if the display is a touch screen). As another example, the CPUs 506 and/or GPUs 508 may include memory (e.g., the memory 504 may be representative of a storage device in addition to the memory of the GPUs 508, the CPUs 506, and/or other components). In other words, the computing device of FIG. 5 is merely illustrative. Distinction is not made between such categories as "workstation," "server," "laptop," "desktop," "tablet,"

"client device," "mobile device," "hand-held device," "game console," "electronic control unit (ECU)," "virtual reality system," and/or other device or system types, as all are contemplated within the scope of the computing device of FIG. 5.

The interconnect system 502 may represent one or more links or busses, such as an address bus, a data bus, a control bus, or a combination thereof. The interconnect system 502 may include one or more bus or link types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, and/or another type of bus or link. In some embodiments, there are direct connections between components. As an example, the CPU 506 may be directly connected to the memory 504. Further, the CPU 506 may be directly connected to the GPU 508. Where there is direct, or point-to-point connection between components, the interconnect system 502 may include a PCIe link to carry out the connection. In these examples, a PCI bus need not be included in the computing device 500.

The memory 504 may include any of a variety of computer-readable media. The computer-readable media may be any available media that may be accessed by the computing device 500. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the memory 504 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by computing device 500. As used herein, computer storage media does not comprise signals per se.

The computer storage media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the computer storage media may include wired media such as a wired network or direct-wired connection, and wireless media such as acoustic, RF, infrared and other wireless media. Combinations of any of the above should also be included within the scope of computer-readable media.

The CPU(s) 506 may be configured to execute at least some of the computer-readable instructions to control one or more components of the computing device 500 to perform one or more of the methods and/or processes described herein. The CPU(s) 506 may each include one or more cores (e.g., one, two, four, eight, twenty-eight, seventy-two, etc.) that are capable of handling a multitude of software threads simultaneously. The CPU(s) 506 may include any type of processor, and may include different types of processors depending on the type of computing device 500 implemented (e.g., processors with fewer cores for mobile devices and processors with more cores for servers). For example, depending on the type of computing device 500, the processor may be an Advanced RISC Machines (ARM) processor implemented using Reduced Instruction Set Computing (RISC) or an x86 processor implemented using Complex Instruction Set Computing (CISC). The computing device 500 may include one or more CPUs 506 in addition to one or more microprocessors or supplementary co-processors, such as math co-processors.

In addition to or alternatively from the CPU(s) 506, the GPU(s) 508 may be configured to execute at least some of the computer-readable instructions to control one or more components of the computing device 500 to perform one or more of the methods and/or processes described herein. One or more of the GPU(s) 508 may be an integrated GPU (e.g., with one or more of the CPU(s) 506 and/or one or more of the GPU(s) 508 may be a discrete GPU. In embodiments, one or more of the GPU(s) 508 may be a coprocessor of one or more of the CPU(s) 506. The GPU(s) 508 may be used by the computing device 500 to render graphics (e.g., 3D graphics) or perform general purpose computations. For example, the GPU(s) 508 may be used for General-Purpose computing on GPUs (GPGPU). The GPU(s) 508 may include hundreds or thousands of cores that are capable of handling hundreds or thousands of software threads simultaneously. The GPU(s) 508 may generate pixel data for output images in response to rendering commands (e.g., rendering commands from the CPU(s) 506 received via a host interface). The GPU(s) 508 may include graphics memory, such as display memory, for storing pixel data or any other suitable data, such as GPGPU data. The display memory may be included as part of the memory 504. The GPU(s) 508 may include two or more GPUs operating in parallel (e.g., via a link). The link may directly connect the GPUs (e.g., using NVLINK) or may connect the GPUs through a switch (e.g., using NVSwitch). When combined together, each GPU 508 may generate pixel data or GPGPU data for different portions of an output or for different outputs (e.g., a first GPU for a first image and a second GPU for a second image). Each GPU may include its own memory, or may share memory with other GPUs.

In addition to or alternatively from the CPU(s) 506 and/or the GPU(s) 508, the logic unit(s) 520 may be configured to execute at least some of the computer-readable instructions to control one or more components of the computing device 500 to perform one or more of the methods and/or processes described herein. In embodiments, the CPU(s) 506, the GPU(s) 508, and/or the logic unit(s) 520 may discretely or jointly perform any combination of the methods, processes and/or portions thereof. One or more of the logic units 520 may be part of and/or integrated in one or more of the CPU(s) 506 and/or the GPU(s) 508 and/or one or more of the logic units 520 may be discrete components or otherwise external to the CPU(s) 506 and/or the GPU(s) 508. In embodiments, one or more of the logic units 520 may be a coprocessor of one or more of the CPU(s) 506 and/or one or more of the GPU(s) 508.

Examples of the logic unit(s) 520 include one or more processing cores and/or components thereof, such as Tensor Cores (TCs), Tensor Processing Units (TPUs), Pixel Visual Cores (PVCs), Vision Processing Units (VPUs), Graphics Processing Clusters (GPCs), Texture Processing Clusters (TPCs), Streaming Multiprocessors (SMs), Tree Traversal Units (TTUs), Artificial Intelligence Accelerators (AIAs), Deep Learning Accelerators (DLAs), Arithmetic-Logic Units (ALUs), Application-Specific Integrated Circuits (ASICs), Floating Point Units (FPUs), input/output (I/O) elements, peripheral component interconnect (PCI) or peripheral component interconnect express (PCIe) elements, and/or the like.

The communication interface 510 may include one or more receivers, transmitters, and/or transceivers that enable the computing device 500 to communicate with other computing devices via an electronic communication network, included wired and/or wireless communications. The communication interface 510 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet or InfiniBand), low-power wide-area networks (e.g., LoRaWAN, SigFox, etc.), and/or the Internet.

The I/O ports 512 may enable the computing device 500 to be logically coupled to other devices including the I/O components 514, the presentation component(s) 518, and/or other components, some of which may be built in to (e.g., integrated in) the computing device 500. Illustrative I/O components 514 include a microphone, mouse, keyboard, joystick, game pad, game controller, satellite dish, scanner, printer, wireless device, etc. The I/O components 514 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing device 500. The computing device 500 may be include depth cameras, such as stereoscopic camera systems, infrared camera systems, RGB camera systems, touchscreen technology, and combinations of these, for gesture detection and recognition. Additionally, the computing device 500 may include accelerometers or gyroscopes (e.g., as part of an inertia measurement unit (IMU)) that enable detection of motion. In some examples, the output of the accelerometers or gyroscopes may be used by the computing device 500 to render immersive augmented reality or virtual reality.

The power supply 516 may include a hard-wired power supply, a battery power supply, or a combination thereof. The power supply 516 may provide power to the computing device 500 to enable the components of the computing device 500 to operate.

The presentation component(s) 518 may include a display (e.g., a monitor, a touch screen, a television screen, a heads-up-display (HUD), other display types, or a combination thereof), speakers, and/or other presentation components. The presentation component(s) 518 may receive data from other components (e.g., the GPU(s) 508, the CPU(s) 506, etc.), and output the data (e.g., as an image, video, sound, etc.).

Example Data Center

Figure 6:
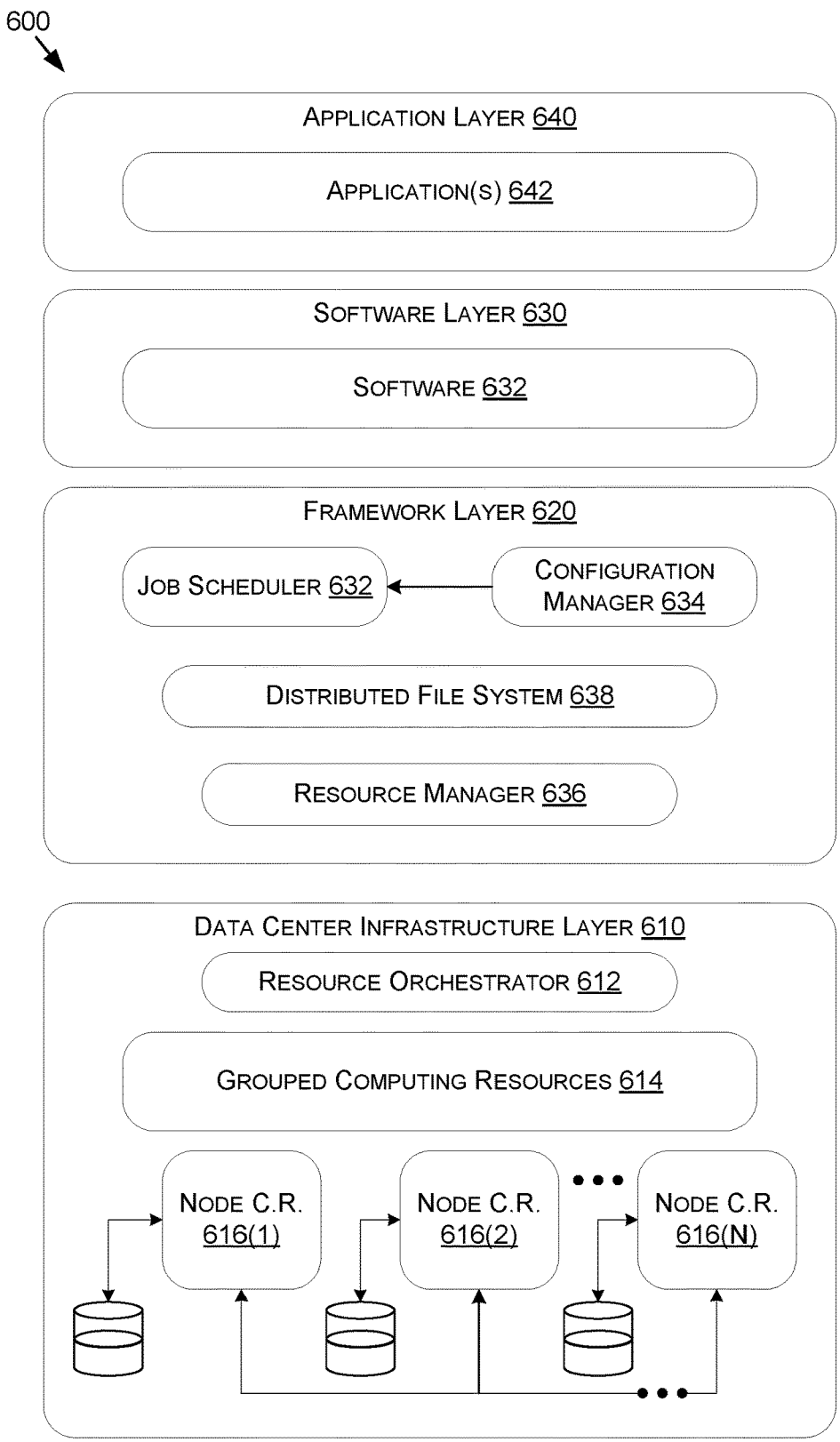
FIG. 6 is a block diagram of an example data center suitable for use in implementing some embodiments of the present disclosure.

FIG. 6 illustrates an example data center 600 that may be used in at least one embodiments of the present disclosure. The data center 600 may include a data center infrastructure layer 610, a framework layer 620, a software layer 630, and/or an application layer 640.

As shown in FIG. 6, the data center infrastructure layer 610 may include a resource orchestrator 612, grouped computing resources 614, and node computing resources ("node C.R.s") 616(1)-616(N), where "N" represents any whole, positive integer. In at least one embodiment, node C.R.s 616(1)-616(N) may include, but are not limited to, any number of central processing units ("CPUs") or other processors (including accelerators, field programmable gate arrays (FPGAs), graphics processors or graphics processing units (GPUs), etc.), memory devices (e.g., dynamic read-only memory), storage devices (e.g., solid state or disk drives), network input/output ("NW I/O") devices, network switches, virtual machines ("VMs"), power modules, and/or cooling modules, etc. In some embodiments, one or more node C.R.s from among node C.R.s 616(1)-616(N) may correspond to a server having one or more of the above-mentioned computing resources. In addition, in some embodiments, the node C.R.s 616(1)-6161(N) may include one or more virtual components, such as vGPUs, vCPUs, and/or the like, and/or one or more of the node C.R.s 616(1)-616(N) may correspond to a virtual machine (VM).

In at least one embodiment, grouped computing resources 614 may include separate groupings of node C.R.s 616 housed within one or more racks (not shown), or many racks housed in data centers at various geographical locations (also not shown). Separate groupings of node C.R.s 616 within grouped computing resources 614 may include grouped compute, network, memory or storage resources that may be configured or allocated to support one or more workloads. In at least one embodiment, several node C.R.s 616 including CPUs, GPUs, and/or other processors may be grouped within one or more racks to provide compute resources to support one or more workloads. The one or more racks may also include any number of power modules, cooling modules, and/or network switches, in any combination.

The resource orchestrator 622 may configure or otherwise control one or more node C.R.s 616(1)-616(N) and/or grouped computing resources 614. In at least one embodiment, resource orchestrator 622 may include a software design infrastructure ("SDI") management entity for the data center 600. The resource orchestrator 622 may include hardware, software, or some combination thereof.

In at least one embodiment, as shown in FIG. 6, framework layer 620 may include a job scheduler 632, a configuration manager 634, a resource manager 636, and/or a distributed file system 638. The framework layer 620 may include a framework to support software 632 of software layer 630 and/or one or more application(s) 642 of application layer 640. The software 632 or application(s) 642 may respectively include web-based service software or applications, such as those provided by Amazon Web Services, Google Cloud and Microsoft Azure. The framework layer 620 may be, but is not limited to, a type of free and open-source software web application framework such as Apache Spark™ (hereinafter "Spark") that may utilize distributed file system 638 for large-scale data processing (e.g., "big data"). In at least one embodiment, job scheduler 632 may include a Spark driver to facilitate scheduling of workloads supported by various layers of data center 600. The configuration manager 634 may be capable of configuring different layers such as software layer 630 and framework layer 620 including Spark and distributed file system 638 for supporting large-scale data processing. The resource manager 636 may be capable of managing clustered or grouped computing resources mapped to or allocated for support of distributed file system 638 and job scheduler 632.

In at least one embodiment, clustered or grouped computing resources may include grouped computing resource 614 at data center infrastructure layer 610. The resource manager 1036 may coordinate with resource orchestrator 612 to manage these mapped or allocated computing resources.

In at least one embodiment, software 632 included in software layer 630 may include software used by at least portions of node C.R.s 616(1)-616(N), grouped computing resources 614, and/or distributed file system 638 of framework layer 620. One or more types of software may include, but are not limited to, Internet web page search software, e-mail virus scan software, database software, and streaming video content software.

In at least one embodiment, application(s) 642 included in application layer 640 may include one or more types of applications used by at least portions of node C.R.s 616(1)-616(N), grouped computing resources 614, and/or distributed file system 638 of framework layer 620. One or more types of applications may include, but are not limited to, any number of a genomics application, a cognitive compute, and a machine learning application, including training or inferencing software, machine learning framework software (e.g., PyTorch, TensorFlow, Caffe, etc.), and/or other machine learning applications used in conjunction with one or more embodiments.

In at least one embodiment, any of configuration manager 634, resource manager 636, and resource orchestrator 612 may implement any number and type of self-modifying actions based on any amount and type of data acquired in any technically feasible fashion. Self-modifying actions may relieve a data center operator of data center 600 from making possibly bad configuration decisions and possibly avoiding underutilized and/or poor performing portions of a data center.

The data center 600 may include tools, services, software or other resources to train one or more machine learning models or predict or infer information using one or more machine learning models according to one or more embodiments described herein. For example, a machine learning model(s) may be trained by calculating weight parameters according to a neural network architecture using software and/or computing resources described above with respect to the data center 600. In at least one embodiment, trained or deployed machine learning models corresponding to one or more neural networks may be used to infer or predict information using resources described above with respect to the data center 600 by using weight parameters calculated through one or more training techniques, such as but not limited to those described herein.

In at least one embodiment, the data center 600 may use CPUs, application-specific integrated circuits (ASICs), GPUs, FPGAs, and/or other hardware (or virtual compute resources corresponding thereto) to perform training and/or inferencing using above-described resources. Moreover, one or more software and/or hardware resources described above may be configured as a service to allow users to train or performing inferencing of information, such as image recognition, speech recognition, or other artificial intelligence services.

Example Network Environments

Network environments suitable for use in implementing embodiments of the disclosure may include one or more client devices, servers, network attached storage (NAS), other backend devices, and/or other device types. The client devices, servers, and/or other device types (e.g., each device) may be implemented on one or more instances of the computing device(s) 500 of FIG. 5—e.g., each device may include similar components, features, and/or functionality of the computing device(s) 500. In addition, where backend devices (e.g., servers, NAS, etc.) are implemented, the backend devices may be included as part of a data center 600, an example of which is described in more detail herein with respect to FIG. 6.

Components of a network environment may communicate with each other via a network(s), which may be wired, wireless, or both. The network may include multiple networks, or a network of networks. By way of example, the network may include one or more Wide Area Networks (WANs), one or more Local Area Networks (LANs), one or more public networks such as the Internet and/or a public switched telephone network (PSTN), and/or one or more private networks. Where the network includes a wireless telecommunications network, components such as a base station, a communications tower, or even access points (as well as other components) may provide wireless connectivity.

Compatible network environments may include one or more peer-to-peer network environments—in which case a server may not be included in a network environment—and one or more client-server network environments—in which case one or more servers may be included in a network environment. In peer-to-peer network environments, functionality described herein with respect to a server(s) may be implemented on any number of client devices.

In at least one embodiment, a network environment may include one or more cloud-based network environments, a distributed computing environment, a combination thereof, etc. A cloud-based network environment may include a framework layer, a job scheduler, a resource manager, and a distributed file system implemented on one or more of servers, which may include one or more core network servers and/or edge servers. A framework layer may include a framework to support software of a software layer and/or one or more application(s) of an application layer. The software or application(s) may respectively include web-based service software or applications. In embodiments, one or more of the client devices may use the web-based service software or applications (e.g., by accessing the service software and/or applications via one or more application programming interfaces (APIs)). The framework layer may be, but is not limited to, a type of free and open-source software web application framework such as that may use a distributed file system for large-scale data processing (e.g., "big data").

A cloud-based network environment may provide cloud computing and/or cloud storage that carries out any combination of computing and/or data storage functions described herein (or one or more portions thereof). Any of these various functions may be distributed over multiple locations from central or core servers (e.g., of one or more data centers that may be distributed across a state, a region, a country, the globe, etc.). If a connection to a user (e.g., a client device) is relatively close to an edge server(s), a core server(s) may designate at least a portion of the functionality to the edge server(s). A cloud-based network environment may be private (e.g., limited to a single organization), may be public (e.g., available to many organizations), and/or a combination thereof (e.g., a hybrid cloud environment).

The client device(s) may include at least some of the components, features, and functionality of the example computing device(s) 500 described herein with respect to FIG. 5. By way of example and not limitation, a client device may be embodied as a Personal Computer (PC), a laptop computer, a mobile device, a smartphone, a tablet computer, a smart watch, a wearable computer, a Personal Digital Assistant (PDA), an MP3 player, a virtual reality headset, a Global Positioning System (GPS) or device, a video player, a video camera, a surveillance device or system, a vehicle, a boat, a flying vessel, a virtual machine, a drone, a robot, a handheld communications device, a hospital device, a gaming device or system, an entertainment system, a vehicle computer system, an embedded system controller, a remote control, an appliance, a consumer electronic device, a workstation, an edge device, any combination of these delineated devices, or any other suitable device.

The disclosure may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The disclosure may be practiced in a variety of system configurations, including hand-held devices, consumer electronics, general-purpose computers, more specialty computing devices, etc. The disclosure may also be practiced in distributed computing environments where tasks are performed by remote-processing devices that are linked through a communications network.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A method comprising:
 analyzing compressed data to determine data segments of the compressed data;
 generating, for the data segments, metadata indicative of an input segment location within the compressed data and an output segment location in an output data corresponding to each data segment of the data segments; and
 associating the metadata with the compressed data.

2. The method of claim 1, wherein the metadata is further indicative of a copy index corresponding to the data segments.

3. The method of claim 1, wherein the metadata is further indicative of an initial input location and an initial output location corresponding to the compressed data.

4. The method of claim 1, further comprising decompressing the data segments in parallel according to the input segment location and the output segment location to generate a decompressed output.

5. The method of claim 1, wherein the input segment location indicates a block input location and the output segment location indicates a block output location for each block of at least two blocks of the compressed data, wherein each data segment corresponds to a single block of the at least two blocks.

6. The method of claim 1, further comprising:
 receiving input data; and
 generating the compressed data by at least compressing the input data.

7. The method of claim 1, wherein the analyzing the compressed data to determine the data segments comprises analyzing the compressed data to determine demarcations between the data segments of the compressed data.

8. The method of claim 1, further comprising:
 identifying dictionary segments of a dictionary associated with the compressed data;
 generating, for the dictionary segments, second metadata indicative of an initial dictionary location corresponding to each dictionary segment of the dictionary segments; and
 associating the second metadata with the compressed data.

9. The method of claim 8, further comprising:
 decompressing the dictionary segments in parallel according to the initial dictionary location of each dictionary segment to generate the dictionary; and
 decompressing, using the dictionary, the data segments in parallel according to the input segment location and the output segment location to generate a decompressed output.

10. A method comprising:
 identifying dictionary segments of a dictionary associated with compressed data;
 generating, for the dictionary segments, metadata indicative of an initial dictionary location corresponding to each dictionary segment of the dictionary segments; and
 associating the metadata with the compressed data.

11. The method of claim 10, wherein the metadata further indicates a symbol index for each dictionary segment of the dictionary segments.

12. The method of claim 10, further comprising decompressing the dictionary segments in parallel according to the initial dictionary location of each dictionary segment to generate the dictionary.

13. The method of claim 10, further comprising:
 analyzing the compressed data to identify data segments of the compressed data, wherein the dictionary segments correspond to the data segments;
 generating, based at least in part on the data segments, second metadata indicative of an input segment location for each data segment of the data segments; and
 associating the second metadata with the compressed data.

14. The method of claim 13, wherein the identifying of the dictionary segments comprises dividing the dictionary in the dictionary segments based at least in part on the data segments.

15. The method of claim 13, further comprising:
decompressing the dictionary segments in parallel according to the initial dictionary location of each dictionary segment to generate the dictionary; and
decompressing, using the dictionary, the data segments in parallel according to the input segment location for each data segment to generate a decompressed output.

16. The method of claim 10, further comprising:
receiving input data; and
generating the compressed data by at least compressing the input data.

17. A system comprising:
one or more processing units to generate, for data segments identified by analyzing compressed data, metadata indicative of an input segment location within compressed data and an output segment location in an output data corresponding to each data segment of the data segments of the compressed data.

18. The system of claim 17, wherein the one or more processing units are further to generate second metadata indicative of an initial dictionary location corresponding to each dictionary segment of a dictionary associated with the compressed data.

19. The system of claim 17, wherein the one or more processing units are further to decompress the data segments in parallel according to the input segment location and the output segment location to generate a decompressed output.

20. The system of claim 17, wherein the system is comprised in at least one of:
a control system for an autonomous or semi-autonomous machine;
a perception system for an autonomous or semi-autonomous machine;
a system for performing simulation operations;
a system for performing deep learning operations;
a system for performing real-time streaming broadcasts;
a system for performing video monitoring services;
a system for performing intelligent video analysis;
a system implemented using an edge device;
a system for generating ray-traced graphical output;
a system incorporating one or more virtual machines (VMs);
a system implemented at least partially in a data center; or
a system implemented at least partially using cloud computing resources.

* * * * *